United States Patent [19]

Wolfe et al.

[11] Patent Number: 5,521,783
[45] Date of Patent: May 28, 1996

[54] ELECTROSTATIC DISCHARGE PROTECTION CIRCUIT

[75] Inventors: Edward L. Wolfe, North Andover; Andrew H. Olney, Burlington, both of Mass.

[73] Assignee: Analog Devices, Inc., Norwood, Mass.

[21] Appl. No.: 123,604

[22] Filed: Sep. 17, 1993

[51] Int. Cl.⁶ ............................. H01L 23/62; H02H 9/04
[52] U.S. Cl. .............................. 361/56; 361/91; 257/358
[58] Field of Search ............................ 361/91, 54, 56, 361/58, 59, 98, 100, 101, 111, 212; 257/355–358, 360–364

[56] References Cited

U.S. PATENT DOCUMENTS

| | | | |
|---|---|---|---|
| 4,567,500 | 1/1986 | Avery | 357/38 |
| 4,605,980 | 8/1986 | Hartranft et al. | 361/56 |
| 4,819,047 | 4/1989 | Gilfeather et al. | 357/23 |
| 5,051,860 | 9/1991 | Lee et al. | 361/58 |
| 5,335,134 | 8/1994 | Stein et al. | 361/56 |

OTHER PUBLICATIONS

Analog Devices Data Sheet: AD892E/AD892T, Apr. 1990.

*Primary Examiner*—Jeffrey A. Gaffin
*Assistant Examiner*—Michael J. Sherry
*Attorney, Agent, or Firm*—Koppel & Jacobs

[57] ABSTRACT

An electrostatic discharge (ESD) protection circuit formed on a semiconductor substrate includes a first stage clamping circuit and a second stage clamping circuit separated by a dissipative circuit. The first and second stage clamping circuits are designed to absorb and dissipate the high and low energy ESD, respectively. The first clamping circuit has a self-regulated current mechanism capable of diverting the electrical current generated by an ESD from a high current density region to a low current density region within the semiconductor substrate, and simultaneously lowers the ESD induced voltage for safe protection.

14 Claims, 5 Drawing Sheets

ELECTROSTATIC DISCHARGE PROTECTION CIRCUIT

BACKGROUND OF THE INVENTION

1. Field of the Invention

This invention relates to circuitry for the protection of electronic devices. In particular, this invention is related to the protection of integrated circuits from electrostatic discharges.

2. Description of the Related Art

The demand for fast electronic circuits necessitates the development and manufacturing of high-speed integrated circuits. To achieve this end, integrated circuit manufacturers rely on advanced processing technologies to build integrated circuit components at an increasingly miniaturized scale. The advantages of fabricating integrated circuits with smaller components are multi-fold. To begin with, a higher degree of integration per unit area can be accomplished with smaller devices. This translates into lower costs to the manufacturer since more functions can be integrated into smaller die sizes. Users are also benefitted as the use of densely packaged integrated circuits substantially eliminates the interconnect costs on a circuit board. However, most important of all is the performance improvement associated with smaller integrated circuit components. Having smaller components on a semiconductor substrate, the parasitic elements are substantially curtailed. These parasitic elements include parasitic capacitors, resistors, and occasionally inductors adhering to the boundaries and junction interfaces of individual semiconductor devices. They impede the propagation of electrical signals, thus slowing down the operational speed of the internal circuits in general. Unfortunately, down-sizing the components on a semiconductor substrate also poses a drawback. Components with larger geometrical sizes are normally more robust in terms of power ratings. Smaller devices on a semiconductor substrate are more vulnerable to damage in the event of inadvertent power surges on the devices. With modern-day processing technologies, Metal Oxide Semiconductor (MOS) devices are designed with thinner gate and field oxides, and bipolar devices are fabricated with shallower junction depths. The power ratings on these devices are much lower than their previous counterparts. In the event of an Electrostatic Discharge (ESD), which may occur during fabrication, assembly, testing, handling, transportation, or field application, integrated circuits built with smaller components are more susceptible to damage.

Various schemes were devised in the past to address the ESD issue. The most commonly used method is the attachment of one or more reverse-biased diodes on the signal pad leading to the protected circuit, such that the ESD breaks down the reverse diode before damage can be incurred in the internal circuits. However, due to the pre-existent doping requirements of the semiconductor substrate for the optimal performance of the internal circuits, these diodes built under the restricted doping requirements usually have a breakdown voltage much higher than the intended level considered to be safe. As a consequence, considerable damage to the internal circuits can result before the ESD reaches the breakdown voltage of these reverse diodes. Moreover, during the clamping action, excessive ohmic drops across these diodes caused by the high on-state resistance further raise the protection voltage level. Such high protection voltage level can cause additional destruction to the internal circuitry that initially survives ESD voltages up to the diode breakdown voltage.

More elaborate schemes were adopted in the past to remedy the aforementioned situation. One approach is to adopt a three-stage circuit to suppress the ESD. The first stage is disposed close to the signal pad and comprises a breakdown-type device as discussed in the previous paragraph, or a thick field oxide MOS transistor having a large geometry. The second stage circuit is a resistor, and the third stage is another breakdown-type device capable of clamping the protected line at a voltage lower than the intended protection voltage level. The first stage circuit is installed to absorb high voltage ESD surges with voltage values higher than the breakdown voltage of the first stage clamping circuit. Both the second stage and third stage circuits are installed to absorb ESD generated transients of smaller amplitudes, which are incapable of breaking down the first stage circuit but could cause damage if left unattended. The second and third stages are also called into duty after the first stage successfully breaks down a high voltage spike but clamps the protected line at the breakdown voltage of the first stage circuit. Second and third stages filter out the residuals afterwards, with the third stage clamping the internal circuit to be protected at a safe voltage level and the second stage dissipating the ESD energy within the potential difference of the breakdown voltages of the first stage and the second stage circuits. An example of such type of protection circuit is disclosed in U.S. Pat. No. 4,605,980 to Hantranft et al., Aug. 12, 1986.

Another type of ESD protection circuit is disclosed in U.S. Pat. No. 4,819,047 to Gilfeather et al., Apr. 4, 1989. In Gilfeather et al., the active conduction regions of the transistors are relied on for the diversion of the excessive charges.

All the aforementioned ESD protection circuits use large-sized components, based on the belief that a larger device can withstand larger ESD voltages. However, these components are mostly lateral devices in which current crosses the boundaries of the implant or diffusion regions laterally, resulting in highly crowded current densities in these boundary areas. ESD failures of semiconductor circuits are mostly a result of damage produced by Joule heating in a confined area. Specifically, accumulated heat generated by an extraordinarily high current density in a localized area with insufficient heat dissipation can damage the semiconductor materials. To aggravate the matter, these large devices carry with them sizable parasitic elements that render them slow in response. Very often, an ESD with a fast rise time can easily cause irreparable damage to the internal circuits to be protected before the ESD protection circuit can react.

A major area of concern is the defect loss of integrated circuits during the production cycle. In the past, the production of integrated circuits included much manual handling. Modern day production facilities are substantially more automated. An example of an ESD generated by a production machine is when a bonding wire or a micro-probe comes into close contact with an integrated circuit which sits on a surface at a different voltage potential. ESD from a human is basically different from a machine such as a wire-bonder, or an automatic test equipment.

In the evaluation and study of human-generated ESD, the simplified Human Body Model (HBM) equivalent circuit is commonly used. The HBM basically includes a charged external capacitor discharging through an external series resistor into the integrated circuit. An example of an occurrence of a human-generated ESD event is when a person after walking across an insulated floor or with insulated footwear, thereby accumulating electrical charges, touches an external lead of the integrated circuit. The accumulated electrical charges convert into an ESD directly inducing into the integrated circuit.

In the case with machine-generated ESD, the Charged Device Model (CDM) is generally adopted. A simplified CDM equivalent circuit comprises an internal capacitance associated with a tribolectrically charged integrated circuit discharging through an external series resistor into the machine. An example of an occurrence of a machine-generated ESD event is when an integrated circuit becomes tribolectrically charged, such that when it slides down the chute of an automated test machine, a corner lead on the integrated circuit contacts a grounded portion of the machine thereby triggering an ESD discharging from the integrated circuit into the test machine. Unlike the series resistance associated with a human which is in the order of hundreds of ohms, the series resistance associated with a machine ranges only within a few ohms or less. As a consequence, the rise time associated with a CDM event into a machine is much faster and can sometimes be less than one nanosecond. The test criteria for the HBM discharge can be found in MIL-STD-883 Method 3015 Electrostatic Discharge Sensitivity Classification first released by the Department of Defense in 1979. There is presently no full consensus on test criteria for the CDM, but the semiconductor industry has generally begun to follow EOS/ESD Standard DS5.3 Sensitivity Testing—Charged Device Model, released by the Electrical Overstress/Electrostatic Discharge Association in 1993.

Integrated circuits designed with ESD protection circuits that have a slow response time would result in unacceptable rejects in present day production processes, and consequently unnecessarily increase production costs.

SUMMARY OF THE INVENTION

The electrostatic protection circuit of the present invention is designed to bypass the aforementioned shortfalls. The present invention seeks to provide an ESD protection circuit that is fast in response but without sacrificing any ESD energy handling capability, that is more suitable to protecting integrated circuits during the automated machine manufacturing of the production cycle, that offers a very high degree of protection to all possible combinations of wire-bonding and power pads, and has a compact layout size that saves space on a semiconductor substrate.

In one embodiment of the present invention, a first clamping circuit directly connects to the wire-bonding pad. The first clamping circuit is designed to absorb and dissipate high-energy ESD swiftly. A second clamping circuit is buffered in between the first clamping circuit and the active circuit to be protected. A dissipative resistor, which performs the duty of current limiting, is also placed between the first clamping circuit and the second clamping circuit. The function of the second circuit is to absorb any residual energy left over by the first clamping circuit, or to dissipate any low amplitude ESD that is insufficient to trigger the first clamping circuit.

The design of the first clamping circuit is critical, as most ESD damage is caused by high-energy ESD. In the preferred embodiment of the invention, the first clamping circuit includes a breakdown device having a self-regulated current mechanism. As was previously mentioned, ESD damages are originated by Joule heating caused by excessive current density in a confined space with insufficient heat dissipation. The breakdown device used in the present invention is capable of diverting the electrical current generated by ESD from a high current density region to a low current density region automatically, and simultaneously clamps down the voltage at the wire-bonding pad. With these unique features, the breakdown device does not require excessive geometrical size for robustness as practiced by many prior art ESD protection circuits. In the preferred embodiment of the invention, the breakdown device is a bipolar transistor which is designed to be small in size for the purpose of reducing the parasitic elements, thus improving its response time, without any sacrifices in power rating.

In another embodiment of the invention, more protection is provided to the internal circuits. The possible ESD occurrences between the power supply pad and the wire-bonding pad are also taken into consideration. Essentially, a duplicate of the first ESD protection circuit is placed across the power supply pad and the wire-bonding pad. A high degree of additional ESD protection is thus provided.

DETAILED DESCRIPTION OF THE INVENTION

Figure 1:
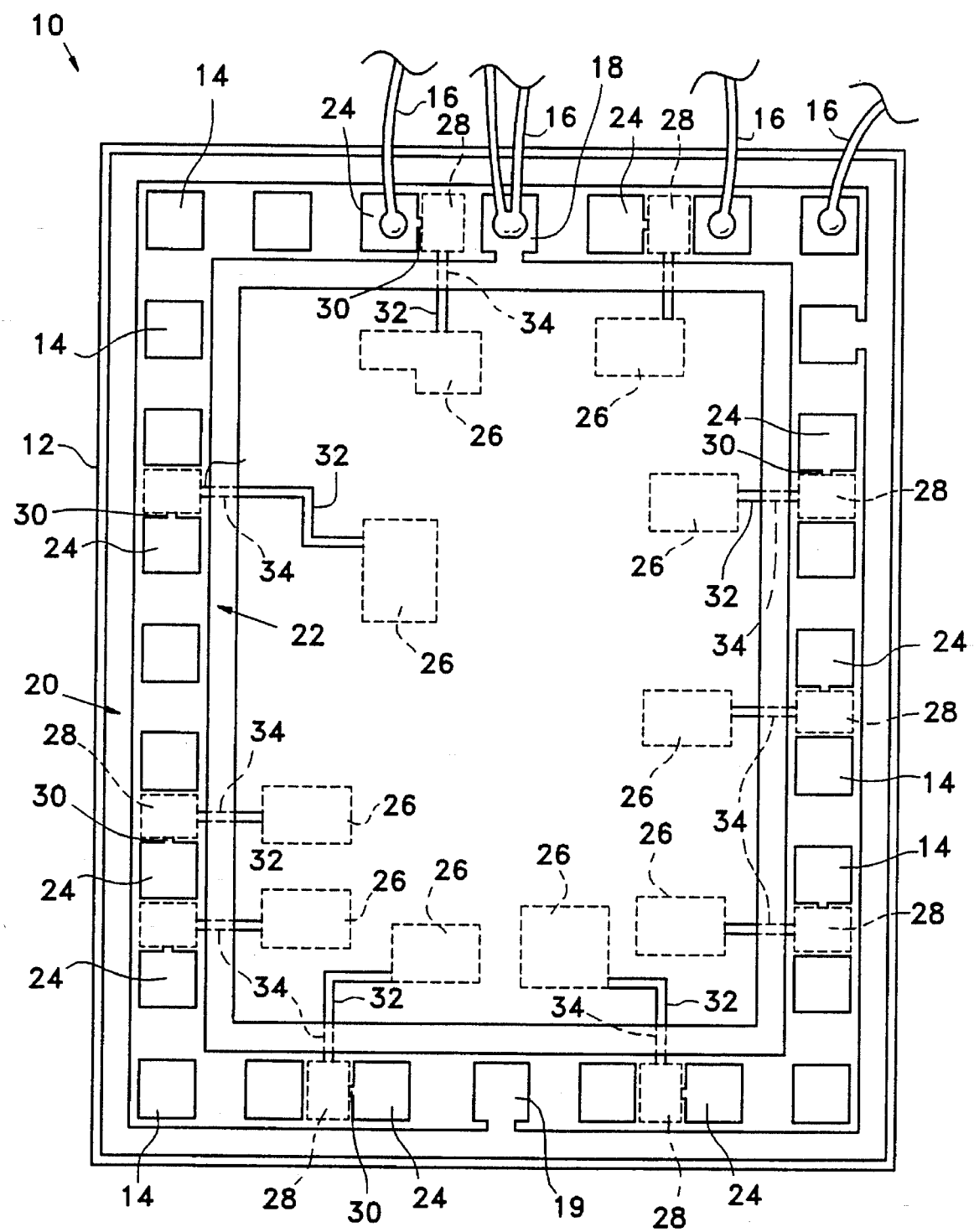
FIG. 1 illustrates a simplified layout of a semiconductor circuit showing typical relative locations of wire-bonding pads, power supply conductors, and the active circuits to be protected on a semiconductor substrate.

Reference is now made to FIG. 1, which is a simplified top plan view of an integrated circuit designated by reference numeral 10, fabricated on a semiconductor substrate. Substrate edge 12 defines the physical dimensions of integrated circuit 10. Integrated circuit 10 is commonly attached to a cavity of a chip housing (not shown) with epoxy or eutectic. A plurality of wire-bonding pads 14 are distributed adjacent the periphery of integrated circuit 10. Integrated circuit 10 electrically communicates with the chip housing (not shown) through bonding wires 16. Typically, one end of bonding wire 16 is attached to wire-bonding pad 14 while the other end is attached to signal fingers (not shown) of the chip housing (not shown). Occasionally, multiple bonding wires are used to reduce ohmic resistances on some of the wire-bonding pads that carry high current, an example of which is shown at power supply pad 18 illustrated in FIG. 1.

For integrated circuit 10 to be operational, power must be properly supplied. A first power supply conductor 22 and a second power supply conductor 20 are assigned this duty. Power conductors 22 and 20 are normally arranged as ring structures around the periphery of integrated circuit 10 for the purpose of an even power distribution. First and second power supply conductors 22 and 20 include first and second power pads 18 and 19, respectively. In the preferred embodiment, the first power supply conductor 22 carries the most positive voltage potential of integrated circuit 10, while the second supply conductor 20 is tied to ground potential. It will be noted that the potential assignment of power supply conductors depends on the application, and can assume various other combinations. For example, the first supply conductor 22 can be assigned to the ground potential, and the second power supply conductor 20 can be allocated to carry a negative potential for integrated circuit 10.

Attention is now directed to signal pads 24. Normally, there are sensitive circuit components inside active circuits 26 that need to protected, and ESD protection circuits 28 are employed to perform this duty. Each ESD protection circuit 28 is electrically connected to and disposed between a signal pad 24 and an active circuit 26 to be protected. In FIG. 1, conductor traces 30 electrically link signal pads 24 to ESD protection circuits 28, while conductor traces 32 electrically connect ESD protection circuits 30 and active circuits 26 to be protected. Notice that in FIG. 1, to avoid electrical shorts with first power supply conductor 22, conductor traces 32 cross first power supply conductor 22 through electrical bridges 34, either in the form of metal lines in different layers or as heavily doped implanted or diffused strips.

Figure 2:
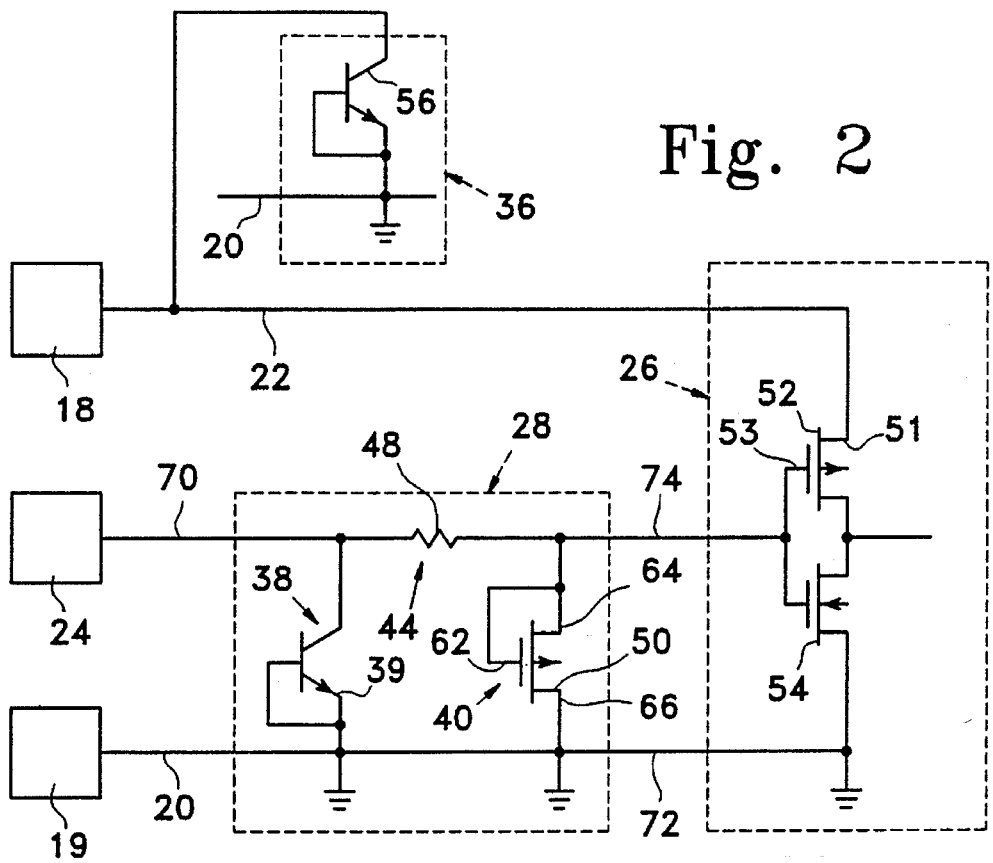
FIG. 2 is a schematic showing one embodiment of the present invention.

FIG. 2 shows one embodiment of the present invention in schematic format. The ESD protection circuit is identified by reference numeral 28, while the active circuit to be protected is identified by reference numeral 26. ESD protection circuit 28 comprises a first clamping circuit 38, a dissipative circuit 44 and a second clamping circuit 40, with dissipative circuit 44 being electrically disposed between first clamping circuit 38 and second clamping circuit 40. In this embodiment, clamping circuit 38 includes a breakdown device, such as a breakdown transistor 39. The operation of breakdown transistor 39 will be discussed in detail later in this specification. Dissipative circuit 44 includes a resistor 48. Resistor 48 in this embodiment is a polysilicon resistor formed on the semiconductor substrate by the process of Chemical Vapor Deposition (CVD). Also, the second clamping circuit 40 includes a p-channel MOS transistor 50. The first clamping circuit 38 is disposed adjacent to signal pad 24, and is electrically connected between the second power supply conductor 20 and the common connection of dissipative circuit 44 and signal pad 24 shown as conductor trace 70 in FIG. 2. The second clamping circuit 40 is electrically connected on one side between dissipative circuit 44 and the active circuit 26 to be protected, and on its other side to second power supply conductor 20. An optional second clamping circuit 36 can also be electrically connected between first power supply conductor 22 and second power supply conductor 20.

Figure 3:
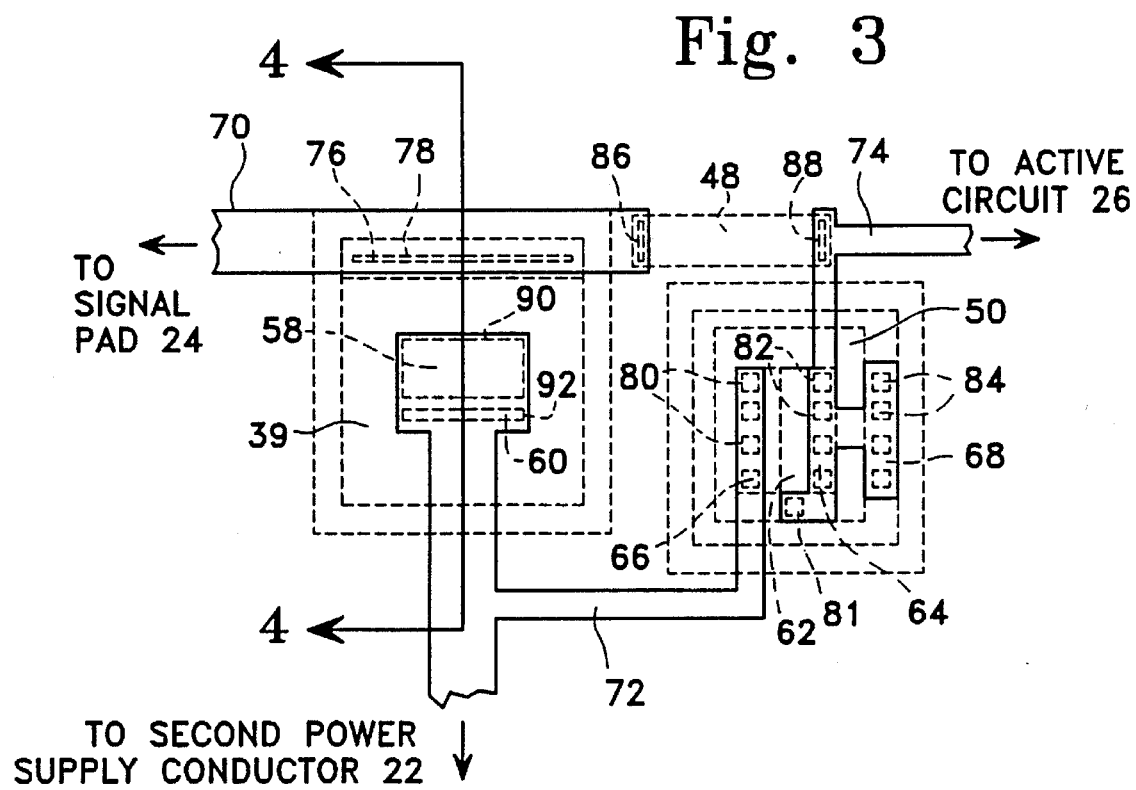
FIG. 3 is a plan view of the layout of the circuit shown in FIG. 2.

FIG. 3 shows a plan view of the layout of the present invention. In FIG. 3, metal traces are shown as solid lines while junction and contact boundaries are illustrated as hidden lines. Breakdown transistor 39, PMOS transistor 50, and polysilicon resistor 48 are linked together by various metal traces. Collector 76 of breakdown transistor 39 communicates with conductor trace 70 through a contact 78. One end of conductor 70 connects to signal pad 24 (shown in FIG. 2), while the other end connects to polysilicon resistor 48 through contact 86. Emitter 58 and base 60 of breakdown transistor 39 are electrically shorted together through contacts 90 and 92, respectively, via conductor trace 72. Conductor trace 72 is connected to both second power supply conductor 20 (shown in FIG. 2), and to drain 66 of MOS transistor 50 through contacts 80. Gate 62, source 64 and substrate 68 of MOS transistor 50 are also electrically connected together through contacts 81, 82 and 84, respectively, by conductor trace 74. Conductor trace 74 is also electrically connected to the other end of polysilicon resistor 48 through contact 88, and directly ties to the active circuit 26 to be protected.

Figure 4:
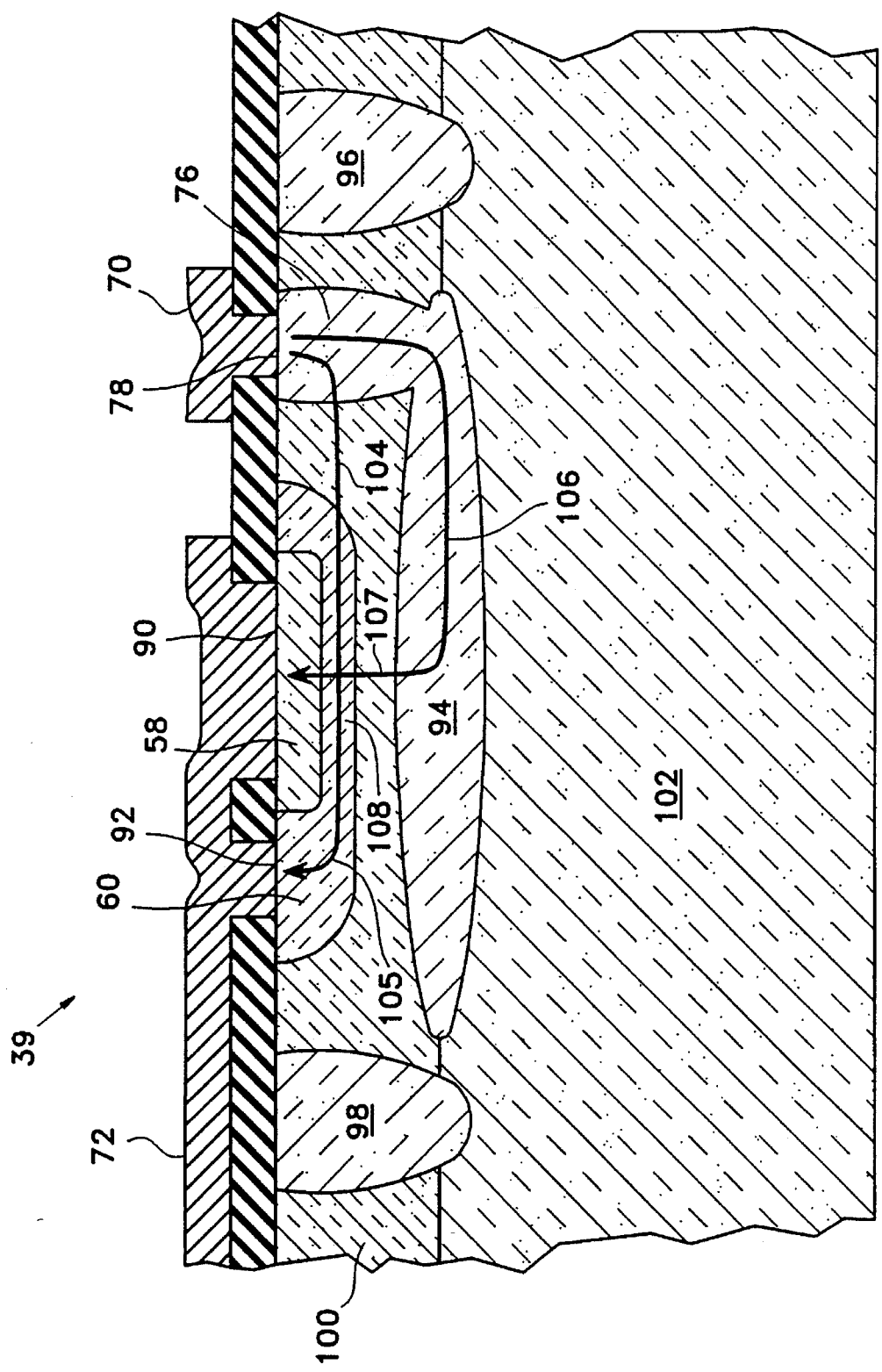
FIG. 4 is a cross-sectional side view taken along line 4—4 of FIG. 3 illustrating the detailed structure of the bipolar transistor.

FIG. 4 shows a cross-sectional side view of breakdown transistor 39 taken along line 4—4 of FIG. 3. For the purpose of a clear illustration, the dimensions of the various junction depths and lateral sizes are not drawn to scale. Reference numeral 102 is the semiconductor substrate onto which an epitaxial layer 100 is grown. The lateral boundaries of transistor 39 are defined by isolations 96 and 98. Isolations 96 and 98 can be an electrical insulator, or semiconductor regions that are electrically biased such that isolations 96 and 98 form reverse-biased junction diodes with epitaxial layer 100. Buried layer 94 is sandwiched between epitaxial layer 100 and substrate 102. Atop buried layer 94 are two diffusion or ion implant layers which form base 60 and emitter 58, respectively, of transistor 39. Notice that a portion of base 60 is located directly under emitter 58. Due to its limited cross-sectional area when current flows in the direction identified by reference numeral 105, this portion of base 60 functions as a resistor designated by reference numeral 108. Resistive base 108 serves a very important function which will be explained later. Collector 76 extends downwardly and merges with buried layer 94.

It should be noted here that the normal design of a bipolar transistor is to reduce the base resistance as much as possible in order to improve the trans-conductance of the device. Transconductance, a parameter that measures the signal gain ability of a device, is defined as the ratio of the output current to the input voltage of the device. During the high frequency signal amplification or switching of a bipolar transistor, the input voltage of the transistor is the base-emitter junction drop in which the ohmic drop across the base region plays a contributing role. Excessive ohmic drop across the resistive base unnecessarily consumes a major portion of the base-emitter voltage drop and degrades the signal gain ability of the transistor. However, the transconductance of transistor 39 is not an important parameter in the application of the present invention, as transistor 39 is used as a two terminal device and there is no signal amplification or switching involved. Thus, base 60 is designed to be resistive instead of conductive. In practice, this is accomplished by positioning base contact 92 farther away from collector contact 78 than is standard, whereby base 60 communicates with collector 76 through a semiconductor region such as the resistive base 108 shown in FIG. 4.

The operation of the ESD protection circuit 28 will be explained in conjunction with the functional mechanism of breakdown transistor 39. Reference is now made to FIG. 2 and FIG. 4. In the preferred embodiment, bipolar transistor 39 and p-channel transistor 50 are designed to have breakdown voltages of approximately 40 Volts and 15 Volts, respectively. The breakdowns of transistors 39 and 50 are substantially avalanche-type. The active circuit 26 to be protected is illustrated as a p-channel transistor 52 and an n-channel transistor 54. Transistors 52 and 54 each having a thin gate oxide which can easily be damaged when the voltage potential at conductor trace 74 exceeds approximately 25 Volts with respect to a second power supply conductor 20. Suppose a positive voltage spike generated by an ESD event is applied across wire-bonding pad 24 and the second power supply conductor 20. When the amplitude of the voltage spike reaches the breakdown voltage of p-channel transistor 50, which is about 15 Volts, transistor 50 conducts to complete a discharge path from wire-bonding pad 24 to the second power conductor 20 through conductor trace 70 and dissipative circuit 44. When the voltage spike continues to rise in amplitude and reaches the breakdown voltage of transistor 39, which is about 40 Volts, transistor 39 triggers into a breakdown conduction mode. At this juncture, the ohmic potential drop (approximately 25 Volts) across resistor 48 plus the breakdown voltage drop (approximately 15 Volts) across p-channel transistor 50 equals the clamped voltage (approximately 40 Volts) of breakdown transistor 39. Notice that conductor trace 74 is still clamped at 15 Volts, and active circuit 26 is always fully protected.

At the onset of breakdown conduction mode for breakdown transistor 39, current flows from its collector 76 to its base 60 laterally in the direction 105 as shown in FIG. 4. With prior art devices, current will flow laterally continuously until the voltage spike dissipates. Lateral current 104 that crosses the shallow junction boundaries can assume very high current densities and generate sufficient heat to cause damage. It is for this reason that prior art devices are designed to be large in size to alleviate the heat problem. However, in the transistor 39 included in the present invention, the continuous flow of current 104 through the resistive base 108 develops a localized potential voltage across base 60. The localized voltage potential developed across base 60 approximately equals the base-emitter drop as the electrical paths share a common conductor 72 as shown in FIG. 4. When the localized voltage potential reaches the turn-on voltage of the base-emitter junction of transistor 39, which is about 0.6 Volt in the preferred embodiment, transistor 39 will be triggered into the normal active conduction mode, in which electrons emitted from emitter 58 flow through buried layer 94 into collector 76, through the forwardly biased base-emitter junction. Phrased differently, current 106 flows (opposite to the direction of electron flow) from collector 76 through buried layer 94 into emitter 58 through the forwardly biased base-emitter junction. Thus, in switching from the breakdown conduction mode to the active conduction mode, lateral current 104 will be diverted into the buried layer 94 and flow as vertical current 107 into the emitter 58, as shown in FIG. 4. At the same time, the collector-emitter voltage will drop down to the normal collector-emitter saturation voltage of transistor 39, which is about 0.2 Volt. Since bonding pad 24 is electrically connected to collector 76 of transistor 39, the voltage at bonding pad 24 will also decrease accordingly. The transformation from the breakdown conduction mode to the active conduction mode for transistor 39 yields several advantages. First, the collector-emitter current 106 flows across the bottom surface of the emitter, which has a larger surface area, current density is reduced accordingly. Second, electrical power, which is defined as the product of voltage and current, is much lower in the active conduction mode than in the breakdown conduction mode. In the breakdown conduction mode, the total voltage across collector 76 and emitter 58 is about 40 Volts, while in the active conduction mode the voltage drop is close to 0.2 Volts. With the spread-out current distribution during the active conduction mode, the voltage current product on a localized area is much lower than during the breakdown conduction mode, thus preventing excessive localized heating resulting in permanent junction damage. The protection process continues until the entire ESD is dissipated.

Now suppose that a voltage spike generated by an ESD having a peak voltage level smaller than the breakdown voltage of transistor 39 strikes across wire-bonding pad 24 and second power supply conductor 22. Such a voltage level can not trigger transistor 39 into action. The second clamping circuit 40 then takes over the role of protection. As was previously mentioned, the voltage level at conductor trace 74 (shown in FIG. 2) can not rise beyond 25 Volts in order to protect the delicate gate oxides of transistors 52 and 54 in active circuit 26. Second clamping circuit 40 is thus required to have a breakdown voltage below 25 Volts. In the preferred embodiment, the breakdown voltage of the second clamping circuit 40 is designed to be approximately 15 Volts. Thus, when the low amplitude spike reaches beyond 15 Volts, transistor 50 breaks down, and current flows from wire-bonding pad 24 through dissipative circuit 48 into second power supply conductor 20 via source 64 and drain 66.

The ESD protection circuit of the present invention also protects against ESD induced spikes of negative polarity. Suppose that a negative voltage spike generated by an ESD impinges across wire-bonding pad 24 and second power conductor 20. In this case, the potential at second power conductor 20 is more positive than the potential at wire-bonding pad 24. Due to its smaller geometrical size with less parasitic elements attached, transistor 39 responds swiftly with its base-collector junction forward biased. Current flows laterally from base 60 to collector 76 in a manner similar to current 104 shown in FIG. 4, but in an opposite direction. However, in this case, the voltage across the base-emitter junction is a normal diode drop, which is about 0.6 Volt in the preferred embodiment. Power, which is equal to the product of voltage and current, is small in this case. The lateral current flow consequently does not result in excessive localized heating.

Thus, with the ESD protection circuit 28 installed in place, active circuit 26 is fully protected. The range of protection in the preferred embodiment is from at least 0 Volt to 2,000 Volts, irrespective of the voltage polarity of the ESD, when tested to the EOS/ESD Association Standard DS5.3 Charged Device Model. The protection range extends further from at least 0 Volt to 3,500 Volts, again, irrespective of the voltage polarity of the ESD, when tested to the MIL-STD-883 Method 3015 Human Body Model.

Figure 6:
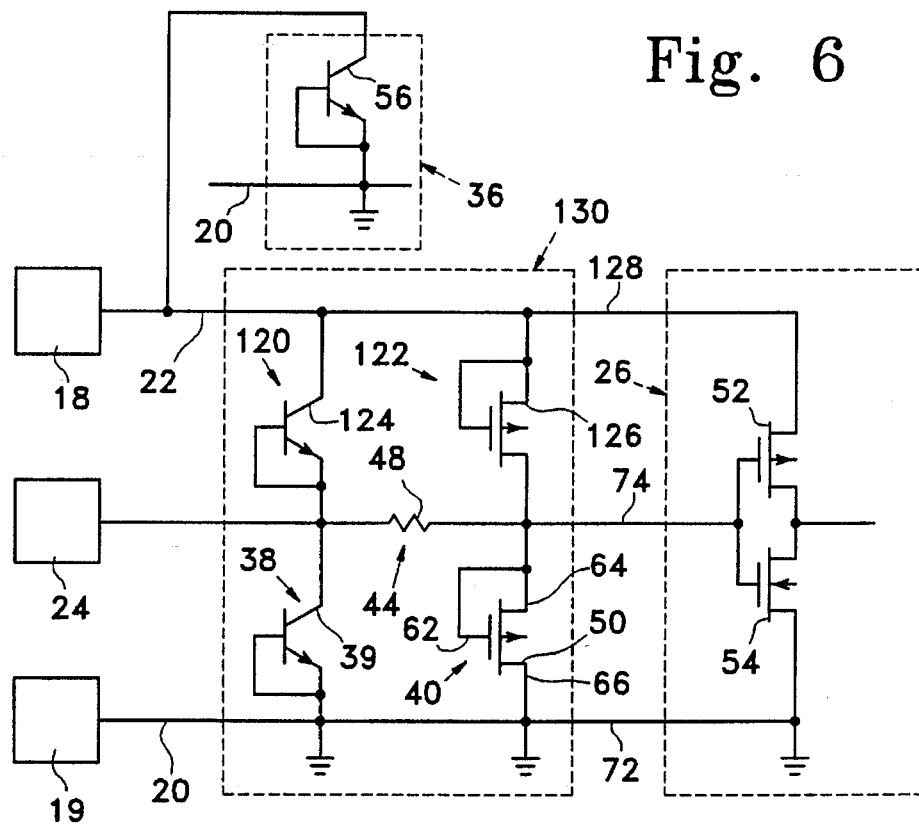
FIG. 6 is a schematic showing another embodiment of the present invention.

Reference is now directed back to FIG. 2. Occasionally, ESD strikes across first power conductor 22 and wire-bonding pad 24. In such an event, p-channel transistor 52 in active circuit 26 is subjected to potentially catastrophic ESD damage. Specifically, a large potential difference appears across gate 53 and source 51 of p-channel transistor 52. The thin gate oxide underneath gate 53 of p-channel transistor 52 can readily be irreparably ruptured. To offer further protection to active circuit 26 in such an occasion, a third clamping circuit 122 and a fourth clamping circuit 120 are added to ESD protection circuit 130 as shown in FIG. 6. Third clamping circuit 122 comprises p-channel MOS transistor 126 which is electrically connected between first power supply conductor 22 and the common connection of second clamping circuit 40, dissipative circuit 44 and active circuit 26 to be protected. Fourth clamping circuit 120 comprises bipolar transistor 124 which is electrically connected between first power supply conductor 22 and the common connection of first clamping circuit 38, wire-bonding pad 24 and dissipative circuit 44. Fourth clamping circuit 120 and third clamping circuit 122 can have electrical characteristics substantially the same as first and second circuits 38 and 40, respectively. The arrangement is clearly shown in FIG. 6 and the plan view layout of FIG. 7.

Figure 5:
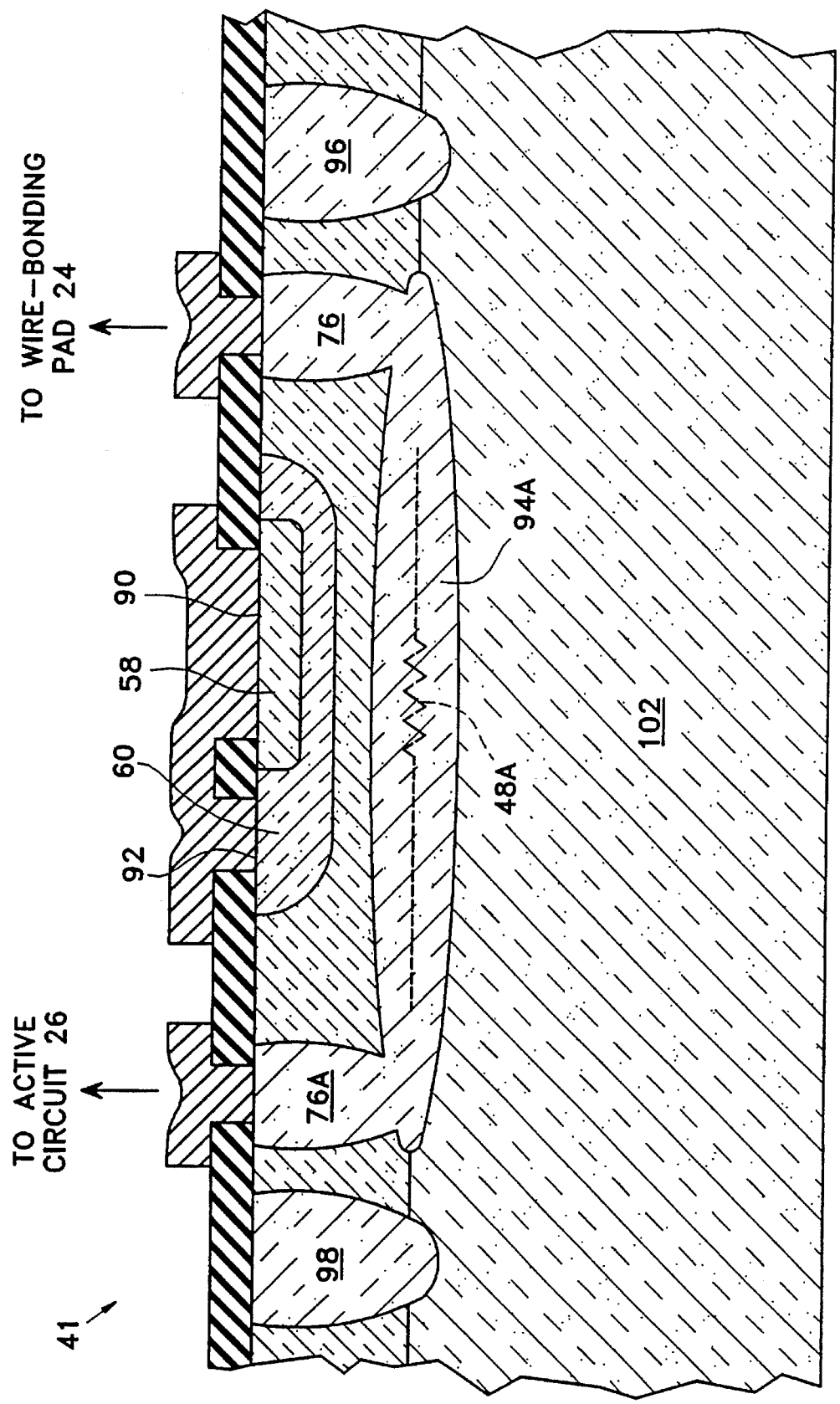
FIG. 5 shows another variation of the bipolar transistor having an elongated buried layer suitable to be used as a resistor.
Figure 7:
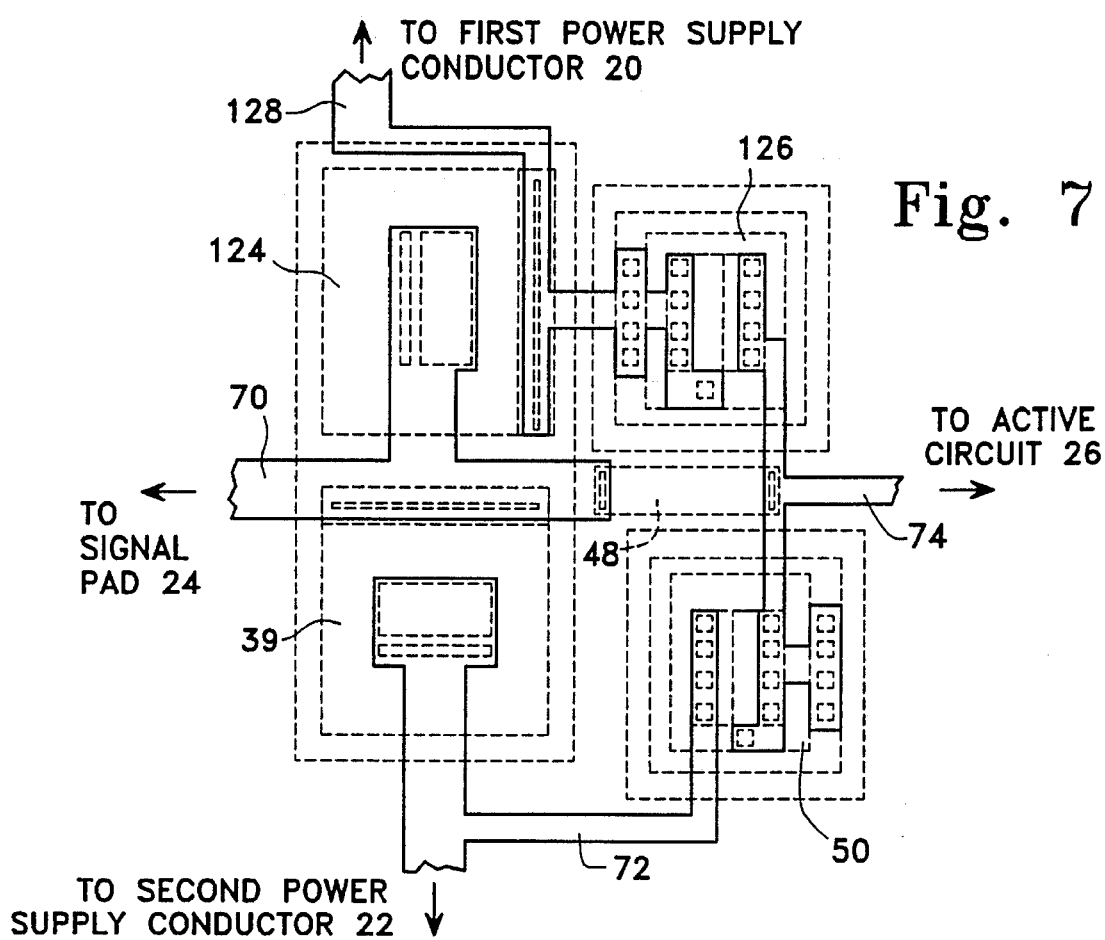
FIG. 7 is a plan view of the layout of the circuit shown in FIG. 6.

The operation of this embodiment is essentially the same as the previous embodiment, and need not be repeated. However, it should be noted that dissipative circuit 44 in FIG. 2 and FIG. 6, shown as resistor 48, can exist in a variety of forms. In FIG. 3 and FIG. 7, resistor 48 is shown as a separate component, which can be an implant, diffused, deposited or sputtered resistor. In the preferred embodiment, it is a polysilicon resistor having a value of about 150 Ohm, deposited on semiconductor substrate 102 by the CVD process. Resistor 48 can also be a parasitic element attached to other components. One example is shown in FIG. 5. The transistor 41 shown in FIG. 5 is essentially the same as transistor 39 shown in FIG. 4, except that an extra collector 76A is implanted or diffused deep into the elongated buried layer 94A. A parasitic resistor 48A shown in hidden lines is formed inside elongated buried layer 94A. With this arrangement, an external resistor can be eliminated and further die space can be saved. Notice that some other arrangements are also possible. For example, resistor 48 can be a parasitic element such as an elongated drain or source in p-channel transistors 50 and 126.

Finally, other changes are possible within the scope of the present invention. In applications which require more than two power supply conductors, each additional power supply conductor can be protected accordingly in a cascaded fashion.

Furthermore, it is also apparent that various transistors can be used interchangeably. For example, NPN transistors can be replaced by PNP devices, and n-channel transistors can substituted for p-channel counterparts, with only minor modifications in the overall circuit.

While the present invention has been shown and described with reference to preferred embodiments thereof, it will be understood by those skilled in the art that these and other changes in form and detail may be made therein without departing from the scope and spirit of the invention.

What is claimed is:

1. An electrostatic discharge protection circuit formed on a semiconductor substrate having an active circuit to be protected, a conductive element that is subject to the receipt of electrostatic discharge, a first power supply conductor and a second power supply conductor, said protection circuit comprising:

a first clamping circuit electrically connected to the conductive element, said first clamping circuit comprising a bipolar transistor having a collector-emitter circuit connected between said conductive element and said second power supply conductor, and a resistive base connected in common with its emitter, said bipolar transistor having a breakdown conduction mode with a primary breakdown current conduction path through its base and an active conduction mode with a primary active current conduction path that is substantially more subsurface in said substrate than said primary breakdown current conduction path, said bipolar transistor responding to an electrostatic discharge at said conductive element in excess of a predetermined limit by entering its breakdown conduction mode and conducting a primary breakdown current sufficient to generate a base voltage differential that triggers said transistor into its active conduction mode, said bipolar transistor during its active conduction mode clamping said conductive element at a voltage that is referenced to said second power supply conductor; and a second clamping circuit electrically connected between said first clamping and the active circuit to be protected.

2. The electrostatic discharge circuit as set forth in claim 1 wherein the collector of said bipolar transistor is connected to said conductive element and its emitter, base and collector establish a portion of said active current conduction path as a generally vertical path that extends below said base.

3. The electrostatic discharge protection circuit as set forth in claim 1, wherein said primary breakdown current generates an ohmic voltage potential across the bipolar transistor's base sufficient to trigger said bipolar transistor to switch from said breakdown conduction mode to said active conduction mode.

4. The electrostatic discharge protection circuit as set forth in claim 1 wherein said second clamping circuit comprises a MOS transistor having a substantially lower breakdown voltage than said bipolar transistor.

5. The electrostatic discharge protection circuit as set forth in claim 4, further comprising a voltage drop circuit electrically connected between said first and second clamping circuits.

6. The electrostatic discharge protection circuit as set forth in claim 5 wherein said dissipative circuit comprises an elongated buried layer underneath said breakdown transistor.

7. The electrostatic discharge protection circuit as set forth in claim 5 wherein said dissipative circuit comprises a resistor on said semiconductor substrate.

8. The electrostatic discharge protection circuit as set forth in claim 7 wherein said resistor is a polysilicon resistor.

9. The electrostatic discharge protection circuit as set forth in claim 1 wherein said second clamping circuit is electrically connected to said second power supply conductor.

10. The electrostatic discharge protection circuit as set forth in claim 9 further comprising:

a third clamping circuit electrically connected to the input of said active circuit to be protected, and further electrically connected between said first power supply conductor and said second clamping circuit.

11. The electrostatic discharge protection circuit as set forth in claim 10 wherein said third clamping circuit comprises a MOS transistor.

12. The electrostatic discharge protection circuit as set forth in claim 11 wherein said MOS transistor comprises a p-type channel, a gate, a drain and a source, with said gate and said source being electrically connected to said first power supply connector and with said drain being electrically connected to the input of said active circuit to be protected.

13. The electrostatic discharge protection circuit as set forth in claim 11 further comprising:

a fourth clamping circuit electrically connected between said wire-bonding pad and said third clamping circuit, and further electrically connected between said first power supply conductor and said first clamping circuit.

14. The electrostatic discharge protection circuit as set forth in claim 13 wherein said fourth clamping circuit comprises a bipolar transistor having electrical characteristics substantially the same as the bipolar transistor in said first clamping circuit.

* * * * *